(12) United States Patent
Wang et al.

(10) Patent No.: US 6,230,113 B1
(45) Date of Patent: May 8, 2001

(54) STIFFNESS EFFECTS IN PIEZOELECTRIC DEVICES

(75) Inventors: Ji Wang, Mountain View, CA (US); Yook-Kong Yong, Princeton, NJ (US); Tsutomu Imai, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/212,816

(22) Filed: Dec. 16, 1998

(51) Int. Cl.$^7$ .............................. G06F 17/50; G06N 7/00
(52) U.S. Cl. ................................ 703/1; 703/2; 703/13; 716/5
(58) Field of Search ....................... 703/1, 13, 2; 716/5

(56) References Cited

U.S. PATENT DOCUMENTS

| | | | |
|---|---|---|---|
| 4,343,827 | 8/1982 | Thompson | 427/8 |
| 5,022,130 | 6/1991 | EerNisse et al. | 29/25.35 |
| 5,048,165 | 9/1991 | Cadwell | 29/25.41 |
| 5,168,191 | 12/1992 | EerNisse et al. | 310/311 |
| 5,323,083 | 6/1994 | Smythe et al. | 310/351 |
| 5,630,949 | 5/1997 | Lakin | 216/61 |

OTHER PUBLICATIONS

Wang, J. et al. "Finite Element Analysis of the Piezoelectric Vibrations of Quartz Plate Resonators with High–Order Plate Theory," Proc. of 1997 IEEE Int'l Frequency Control Symposium, May 1997, pp. 650–658.*

Zhang, Z. et al. "Numerical Analysis of Thickness Shear Thin Film Piezoelectric Resonators using a Laminated Plate Theory," Trans. on Ultrasonics, Ferroelectrics and Frequency Control, vol. 42, No. 4, Jul. 1995, pp. 734–746.*

Yong, Y. et al. "A Perturbation for Finite Element Modeling of Piezoelectric Vibrations in Quartz Plate Resonators," Trans. on Ultrasonics, Ferroelectrics and Frequency Control, vol. 40, No. 5, Sep. 1993, pp. 551–562.*

Brissaud, M. "Characterization of Piezoceramics," Trans. on Ultrasonics, Ferroelectrics and Frequency Control, vol. 38, No. 6, Nov. 1991, pp. 603–617.*

Lerch, R. "Finite Element Analysis of Piezoelectric Transducers," IEEE Proc. of Ultrasonics Symposium, vol. 2, Oct. 1988, pp. 643–654.*

\* cited by examiner

Primary Examiner—Tariq R. Hafiz
Assistant Examiner—Kyle J. Choi

(57) ABSTRACT

A method for verifying the design of piezoelectric devices includes expressing attributes of such piezoelectric device or subsystem thereof in terms of an elastic property or properties of a different subsystem or device component of the piezoelectric device. Such piezoelectric device may include a layer of piezoelectric material and one or more electrodes affixed to one or more faces of such layer. Computational complexity of models of the design are reduced by modeling displacement of the electrodes as being equal to displacement of the layer of piezoelectric material during operation of such piezoelectric device. Further reduction in computational complexity is achieved by modeling electrode displacement as being uniform within each electrode. Stress in the piezoelectric device or subsystem thereof is expressed in terms of elastic properties of a different subsystem of the piezoelectric device. Further any express dependence on strain in a subsystem or device component of the piezoelectric device may be eliminated to reduce model complexity. Higher order terms of such models can be ignored in many instances for further reduction in computational complexity.

19 Claims, 2 Drawing Sheets

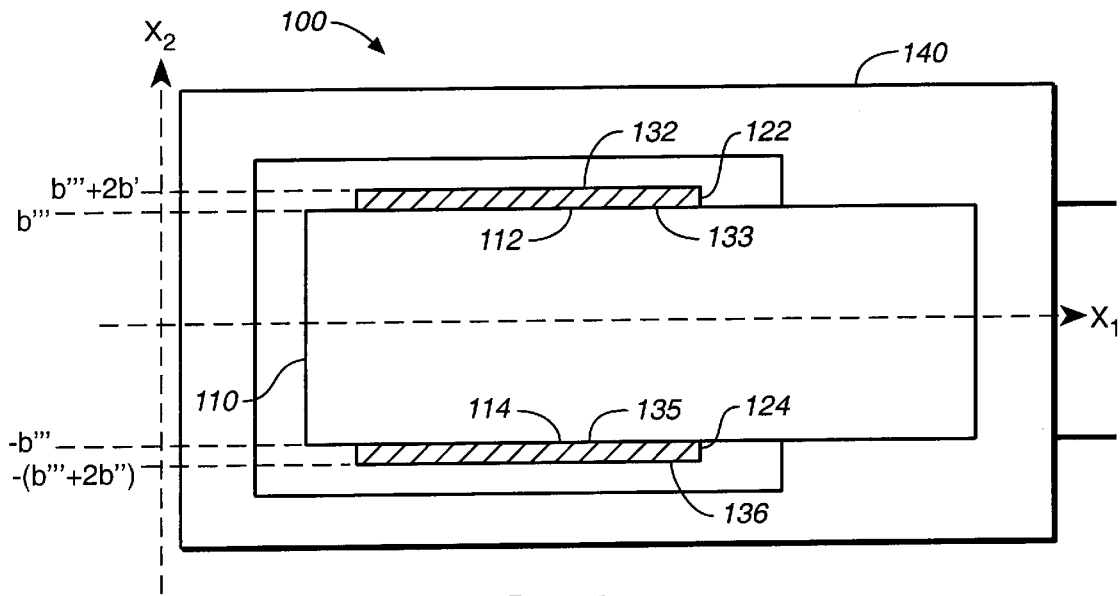
FIG._1
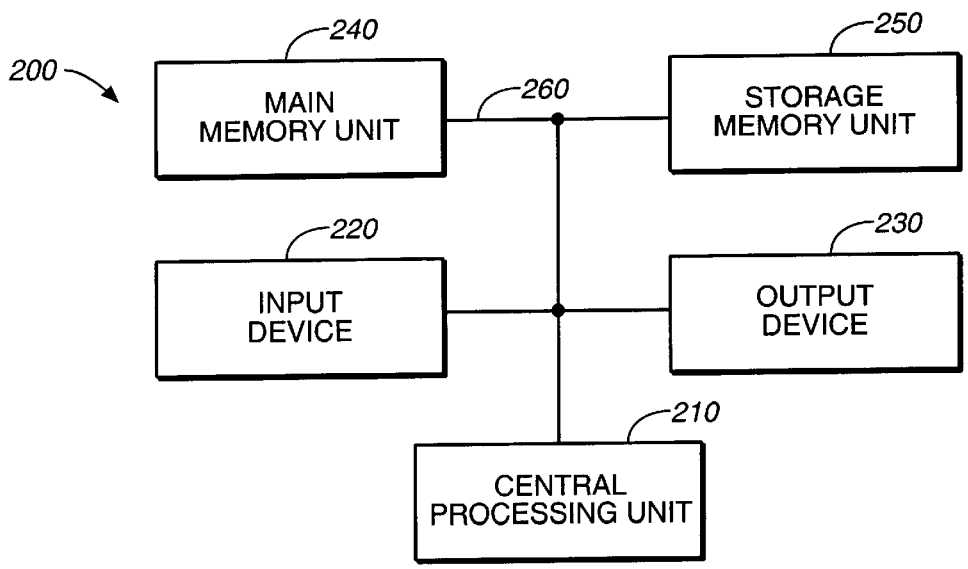
FIG._2

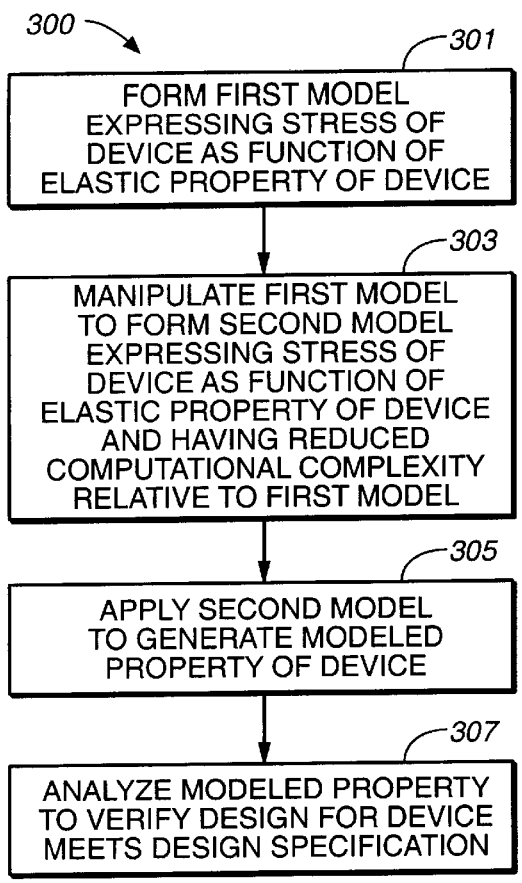
FIG._3
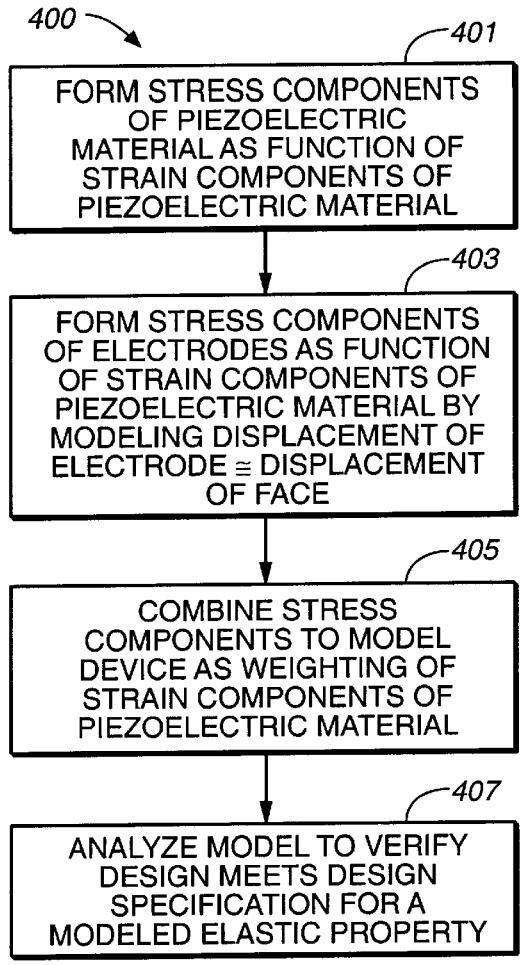
FIG._4
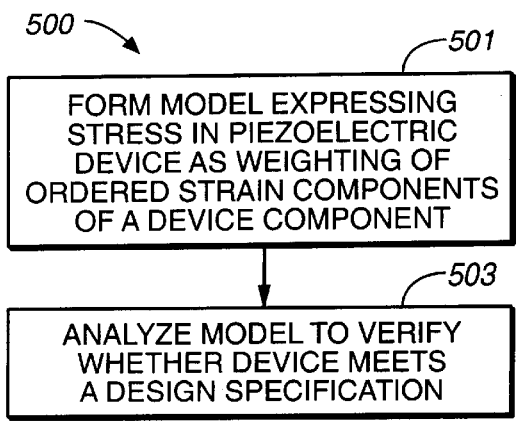
FIG._5
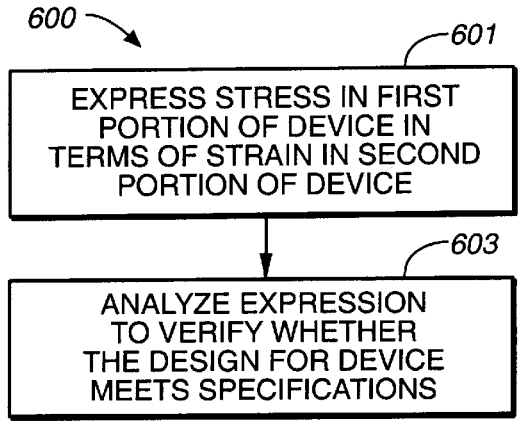
FIG._6

STIFFNESS EFFECTS IN PIEZOELECTRIC DEVICES

TECHNICAL FIELD

The present invention relates to the field of piezoelectric devices. More particularly, the present invention relates to designing piezoelectric devices to comply with design specifications.

BACKGROUND ART

A wide variety of piezoelectric devices are in common use in various electronics applications. One common type of piezoelectric device is a crystal resonator. A typical crystal resonator includes a layer of crystalline piezoelectric material having opposite faces, with each face having a corresponding electrode bonded thereto, thereby sandwiching the piezoelectric material between the electrodes. The crystal resonator vibrates in response to an electrical stimulus applied to the electrodes. The vibration induces a highly stable electrical oscillation across the electrodes that is useful for timing other devices. Another common type of piezoelectric device is the crystal filter. One variety of crystal filter includes a layer of crystalline piezoelectric material having opposite faces, an electrode affixed to one of the faces, and a pair of electrodes affixed to the other face. The pair of electrodes induces two frequency peaks in electrical conductivity of the crystal filter, with a bandpass filter being formed by suitably adjusting the location of the peaks.

For a piezoelectric device to operate properly, it is important for its elastic properties to fall within design specifications. For example, if the stiffness of a crystal resonator falls outside design specifications, the crystal resonator may not have the desired oscillation frequency. Similarly, if the stiffness in a crystal filter falls outside design specifications, the crystal filter may not have the desired magnitude response. Unfortunately, it has proven very difficult to provide piezoelectric devices with precisely determined elastic properties. One reason for this difficulty is that there is considerable interplay between the various elastic properties of a piezoelectric device. For example, increasing electrode mass to reduce acceleration sensitivity may yield an undesired side effect such as a shift away from desired resonant frequency.

Due to such difficulties, piezoelectric devices generally are formed in a rough state that is not guaranteed to be within final design specifications. The piezoelectric devices may then be brought into final design specifications by adding or removing material from the piezoelectric device. In one conventional approach, material is added or removed from electrodes. In another conventional approach, stiffening electrical fields are applied to a piezoelectric device during operation. In a third conventional approach, a piezoelectric device is stiffened to reduce acceleration sensitivity by adding one or more braces either on the electrodes or on the layer of piezoelectric material.

Such conventional approaches to providing piezoelectric devices with desired elastic properties are undesirable. They are not truly design based, but rather require extra fabrication steps, such as adding or removing material from electrodes, or special operating environments, such as appropriate stiffening electrical fields. Generation of stiffening electrical fields may require additional circuitry. Conventional approaches typically also require the formation of various prototype devices to determine how to fabricate the piezoelectric device with a suitable rough state as described above. Further, conventional approaches are believed to work poorly where electrode thickness exceeds about two percent of total device thickness.

There is accordingly a continuing need in the electronics arts for an improved system and an improved method for providing piezoelectric devices with desired elastic properties. Such system and method preferably should be designed based, so that extra fabrication steps and generation of special operating environments are avoided. Such system and method preferably should be usable with a wide variety of piezoelectric devices, including crystal filters and crystal resonators. Further, there is also a continuing need for improved piezoelectric devices which meet final design specifications without the need for post production processing of the devices.

DISCLOSURE OF INVENTION

It is an object of the present invention to provide a system and a method for verifying design characteristics of piezoelectric devices during a design process which conveniently can be performed before any manufacturing steps. It is another object of the present invention to provide improved piezoelectric devices having stiffness determined during a design stage, thereby reducing requirements for post production processing of the piezoelectric devices.

In accordance with one aspect of the present invention, a method for verifying a design for a piezoelectric device comprises forming a model of the piezoelectric device that expresses a stress component of the piezoelectric device as a weighting of strain components of a first device component of the piezoelectric device. The model is analyzed to verify whether the piezoelectric device, or a second device component thereof, meets a design specification. For example, the model may be analyzed to verify whether the piezoelectric device (or the electrode or electrodes thereof) are suitably stiff, and further to verify the stiffness quality of the piezoelectric device (or the electrode or electrode thereof) on an absolute or other scale. The first and second device components do not need to be the same. For example, an electrode may be verified for suitable stiffness by analyzing a weighting of strain components of the layer of piezoelectric material. This beneficially reduces computational complexity of the model of the piezoelectric device by eliminating expressed dependence therein on strain components of the electrodes while retaining useful information about the electrodes such as their stiffness quality.

In accordance with another aspect of the present invention, a method for verifying a design for a piezoelectric device comprises forming a first model of the piezoelectric device that expresses stress in the device as a function of an elastic property and deformation of the device. Such elastic property may be, for example, the stiffness of the piezoelectric device or the layer of piezoelectric material. Preferably the deformation is represented by the strain of the layer of piezoelectric material, with such strain expressed as a weighting of three or more strain components determined at the faces of the layer of piezoelectric material. The first model is then manipulated to form a second model of the device having a reduced computational complexity relative to the first model. For example, stress in the piezoelectric device as a whole can be expressed as a function of strain of the layer of piezoelectric material. This reduces computational complexity of the second model relative to the first model by eliminating express dependence in the second model on the strain or strain components of the electrodes. The second model is beneficially applied to generate a modeled property of the device, such as device or electrode stiffness quality, and the modeled property is analyzed to verify whether the design for the device meets design specifications.

In a preferred embodiment of the present invention, stress in the piezoelectric device is represented by stress components $T_{ij}^{(n)}$ of the piezoelectric device, where n takes on integer values between zero and three. To reduce computational complexity in this embodiment of the present invention, preferably only the first four stress components $T_{ij}^{(0)}, T_{ij}^{(1)}, T_{ij}^{(2)}, T_{ij}^{(3)}$ are used. Each of the stress components $T_{ij}^{(n)}$ are expressed as a weighted sum of strain components $S_{kl}^{(m)}$ of the piezoelectric device, preferably the first four strain components $S_{kl}^{(0)}, S_{kl}^{(1)}, S_{kl}^{(2)}$, and $S_{kl}^{(3)}$. Using only the first four strain components $S_{kl}^{(0)}, S_{kl}^{(1)}, S_{kl}^{(2)}$, and $S_{kl}^{(3)}$ is believed to yield highly accurate results and to reduce computational complexity by ignoring strain components $S_{kl}^{(m)}$ of order four or more. The strain components may be those of the piezoelectric device as a whole. For additional reduction of computational complexity, the displacement of the electrodes can be modeled as being substantially equal to displacement of the layer of piezoelectric material, substantially equal to displacement of the face or faces of the layer of piezoelectric material, or substantially continuous across the junction between the layer of piezoelectric material and the electrode or electrodes. This beneficially allows the stress components of the electrodes, for example, to be expressed in terms of the strain components of the layer of piezoelectric material, thereby eliminating any expressed dependence on strain components of the electrodes in the weighted sum. The model is then analyzed to verify whether the piezoelectric device or device components thereof meet design specifications.

In accordance with another aspect of the present invention, an improved piezoelectric device beneficially has reduced requirements for post production processing relative to conventional piezoelectric devices. The improved piezoelectric device includes an electrode affixed to a layer of the piezoelectric material. Stiffness of the electrode, the layer of piezoelectric material, and the piezoelectric device are determined during design of the piezoelectric device by modeling displacement of the electrode as being substantially equal in distance to displacement of the layer of piezoelectric material. This beneficially allows electrode stiffness and device quality to be determined without the conventional requirements of post production addition or removal of electrode material or other bracing. Examples of the improved piezoelectric devices thus may be more uniform in size, shape, and appearance than conventional piezoelectric devices in finished state.

In accordance with another aspect of the present invention, a computer-implemented system for performing the method of the present invention to verify designs of piezoelectric devices includes a central processing unit, an input device, an output device, a main memory unit, a storage memory unit, and a bus. The main memory unit and storage memory unit are machine readable media, and more particularly, are readable by the central processing unit. The storage memory unit stores a program of instructions which, when read by the central processing unit, are capable of directing the central processing unit to perform the method for verifying a design of a piezoelectric device in accordance with the present invention. The computer-implemented system can perform design stage acts for fabricating an improved piezoelectric device according to the present invention, or alternatively can be used to verify the design of arbitrary piezoelectric devices both before, during, and after their fabrication.

In accordance with a preferred aspect of the present invention, each electrode of a piezoelectric device under design is verified in accordance with the present invention. Such verification determines whether such electrode meets one or more design specifications. Various verified properties of the electrodes, such as whether an electrode meets stiffness specifications and the stiffness quality of the electrodes on an absolute scale, beneficially can be determined by the verification. The verified properties can be used directly as a measure of device quality, or alternatively, can be subjected to further analysis to determine other properties of the piezoelectric device, such as the capacitance, inductance, resistance, and frequency - temperature characteristics of the device.

The system and the method of the present invention can generally be used to verify design characteristics of piezoelectric devices having a layer of piezoelectric material and at least one electrode affixed to the face of such layer. The system and the method can also be beneficially employed to verify the design of piezoelectric devices having a plurality of faces and or electrodes, such as the common piezoelectric crystal resonator. To obtain accurate results from the present invention, it is believed that the thickness of each electrode should be about five percent or less of the total thickness of the piezoelectric device.

The various features of the present invention and its preferred embodiments may be understood with greater particularity by referring to the following discussion and the accompanying drawings in which like reference numerals refer to like elements in the several figures. The contents of the following discussion and the drawings are set forth as examples only and should not be understood to represent limitations upon the scope of the present invention.

BRIEF DESCRIPTION OF DRAWINGS

FIG. 1 is a cross sectional view of a design of a piezoelectric device having two electrodes affixed to opposite faces of a layer of piezoelectric material.

FIG. 2 is a functional block diagram of a computer-implemented system according to the present invention for carrying out various aspects of the method for verifying the design of a piezoelectric device according to the present invention.

FIG. 3 is a flowchart illustrating a method for verifying the design of a piezoelectric device, wherein a first model of the piezoelectric device is formed and manipulated to generate a second model thereof having reduced computational complexity relative to the first model, and the second model is applied to verify the piezoelectric device, according to another embodiment of the present invention.

FIG. 4 is a flowchart illustrating a method for verifying the design of a piezoelectric device, wherein a model of the piezoelectric device expressing a stress component as a weighting of strain components is formed, and the model is analyzed to verify whether the device meets design specifications, according to another embodiment of the present invention.

FIG. 5 is a flowchart of a method for verifying the design of the piezoelectric device, wherein stress components for the piezoelectric material and stress components for the electrodes are both expressed as functions of strain components of the piezoelectric material according to another embodiment of the present invention.

FIG. 6 is a flowchart of a method for verifying the design of the piezoelectric device according to the present invention, wherein stress components for a first portion of the piezoelectric device are expressed in terms of strain components of a second portion of the piezoelectric device, and the expression is analyzed to verify whether the design of the piezoelectric device meets design specifications.

MODES FOR CARRYING OUT THE INVENTION

The present invention provides a system and a method for verifying design characteristics of piezoelectric devices and device components thereof during a design process which conveniently can be before any manufacturing steps of either the piezoelectric device and of its device components. The present invention also provides improved piezoelectric devices having stiffness determined during a design stage, thereby reducing requirements for any additional processing of the devices post production relative to conventional piezoelectric devices. The present invention is believed to yield accurate results where the thickness of each electrode of the piezoelectric device does not exceed about five percent of the total thickness of the piezoelectric device.

Referring now to FIG. 1, there is shown a cross sectional view of a design for a piezoelectric device 100. The piezoelectric device 100 includes a layer of piezoelectric material 110 affixed to a pair of electrodes 122, 124. More particularly, electrode 122 has top and bottom faces 132, 133, and electrode 124 has top and bottom faces 135, 136. The bottom face 133 of electrode 122 is affixed to the top face 112 of the layer of piezoelectric material 110, and the top face 135 of electrode 124 is affixed to the bottom face 114 of the layer of piezoelectric material 110. The electrodes 122, 124 may be formed in conventional manner by deposition of thin layers of conductive material on the top and bottom faces 112, 114 of the layer of piezoelectric material 110. Typically, the thickness 2b', 2b" of each electrode 122, 124 would not exceed about two percent of the total thickness 2(b'+b"+b''') of the piezoelectric device 110. However, it is noted that accurate results may be obtained according to the present invention where the thickness of each electrode 122, 124 is about five percent or less of the total thickness of the piezoelectric device 100. For protective purposes, the piezoelectric device 100 generally is mounted in a sealing case 140. This may be achieved, for example, by bonding or welding the layer of piezoelectric material 110 to the sealing case 140.

In operation, the electrodes 122, 124 and layer of piezoelectric material 110 vibrate in unison in response to an electrical potential applied across the electrodes 122, 124. The vibration induces an electrical oscillation across the electrodes 122, 124. The electrical oscillation is highly stable and may beneficially be used, for example, as a frequency generator, or for timing or clocking other devices. In accordance with the present invention, the design for piezoelectric device 100 is verified to assure that the piezoelectric device 100 will operate properly.

Referring now to FIG. 2, there is shown a functional block diagram of an embodiment of a computer-implemented system 200 suitable for carrying out various aspects of the present invention, including verification of the design of piezoelectric devices such as piezoelectric device 100. The computer-implemented system 200 includes a central processing unit 210, an input device 220, an output device 230, a main memory unit 240, and a storage memory unit 250, and a multi-bit bus 260.

Hardware components of the computer implemented system 200 beneficially may have a variety of designs. For example, the central processing unit 210 can be an Intelx86™ compatible microprocessor, such as a Pentium® or Pentium II® microprocessor commercially available from Intel Corporation of Santa Clara, Calif., or can be a conventional Power PC® microprocessor commercially available from Apple Computer, Inc. of Cupertino, Calif. The central processing unit 210 preferably includes a floating-point math coprocessor to increase performance speed on various calculations performed in accordance with the method of the present invention. The input device 220 can be any suitable device for supplying information to the central processing unit 210, such as a conventional keyboard or mouse. The output device 230 can be, for example, a conventional cathode ray tube (CRT) monitor or a printer. The main and storage memory units 240, 250 are machine readable media capable of being read by the central processing unit 210, and may be of conventional design. For example, the main memory unit 240 can be a dynamic random access memory unit (DRAM) or a static random access memory unit (SRAM), and the storage memory unit 250 can be a compact disk (CD) and corresponding drive, a digital versatile disk (DVD) and corresponding drive, or a conventional hard disk and corresponding drive. The storage memory unit 250 stores a program of instructions which are capable of directing the central processing unit 210 to perform the method for verifying a design of a device in accordance with the present invention. The multi-bit bus 260 can be of conventional design. Interconnection of hardware components of the computer-implemented system 200 by multi-bit bus 260 is achieved in a conventional manner.

In operation, a user inputs parameters of the piezoelectric design under consideration into the computer implemented system 200 via the input device 220. In response to such input from the user, the central processing unit 210 reads the storage memory unit 250 via the bus 260 and main memory unit 240 to obtain the program of instructions. In response to the program of instructions and the input from the user, the central processing unit 210 performs an embodiment of the method for verifying the design of a piezoelectric device in accordance with the present invention.

Referring now to FIG. 3, there is shown a flowchart of operation for the computer-implemented system 200 for performing a first embodiment of the method of the present invention to verify the design of the piezoelectric device 100 of FIG. 1. In response to the input from the user and the program of instructions read from storage memory unit 250, the computer-implemented system 200 forms 301 a first model of the piezoelectric device 100. The first model expresses stress in the piezoelectric device 100 as a function of an elastic property of the piezoelectric device 100. The computer-implemented system 200 represents stress in the piezoelectric device 100 by a sequence of stress components $T_{ij}^{(n)}$ of the piezoelectric device 100, where n=0, 1, 2, . . . N with N being a suitably large integer value, and where the indices i and j denote integers from the set {1, 2, 3} with these integers 1, 2, 3 representing orthogonal directions of a right handed Cartesian coordinate system {$x_1$, $x_2$, $x_3$}. Referring now also to FIG. 1, coordinate direction $x_2$ represents the direction perpendicular to the faces 112, 114 of the layer of piezoelectric material 110 as shown.

The stress components $T_{ij}^{(n)}$ are functions of stress in the piezoelectric device 100. This stress can be represented in conventional manner by a stress tensor $T_{ij}$. In terms of the stress tensor $T_{ij}$, the stress components $T_{ij}^{(n)}$ are given as:

$$T_{ij}^{(n)} = \int_{-(b'''+2b'')}^{b'''+2b'} T_{ij} x_2^n \, dx_2 \qquad \text{(Eq. 1A)}$$

The index n of the stress components $T_{ij}^{(n)}$ may have various integer values, and the indices i and j each take on various values from the set of coordinate directions {1, 2, 3}. Due to the integration in Equation 1A, the stress components $T_{ij}^{(n)}$ are functions of the integration's boundary conditions $-(b'''+2b'')$ and $(b'''+2b')$ along coordinate direction $x_2$. The stress components $T_{ij}^{(n)}$ may thus be more particularly identified as the stress components at the top and bottom surfaces 132, 136 of the piezoelectric device 100, (i.e. at the top face 132 of electrode 122 and at the bottom face 136 of electrode 124).

In a similar manner, there are defined strain components $S_{kl}^{(m)}$ of the piezoelectric device 100 as functions of strain in the piezoelectric device 100, and such strain can be represented in conventional manner by a strain tensor $S_{kl}$ for the piezoelectric device 100. The relationship between the strain tensor $S_{kl}$ and the strain components $S_{kl}^{(m)}$ is given as:

$$S_{kl} = \sum_{m=0}^{\infty} x_2^m S_{kl}^{(m)}, \qquad \text{(Eq. 1B)}$$

and may be identified as strain components at the top and bottom surfaces 132, 136 of the piezoelectric device 100. The index m of the strain components $S_{kl}^{(m)}$ may have various integer values, and the indices k and l each take on various values from the set of coordinate directions {1, 2, 3}.

The stress components $T_{ij}^{(n)}$ can be expressed as functions of the strain components $S_{kl}^{(m)}$ according to the relationship $$T_{ij}^{(n)} = \sum_{m=0}^{\infty} B_{mn} C_{ijkl} S_{kl}^{(m)}. \qquad \text{(Eq. 2)}$$

For each value of index n, the value of index m may run from zero to infinity for exact equality between Equations 1A and 2. The indices i, j, k and l are independent of one another and can take on the various values from the set of coordinate directions {1, 2, 3}. Terms $B_{mn}$ and $C_{ijkl}$ respectively are a constant of integration and an elastic constant tensor of the piezoelectric device 100. $B_{mn}$ and $C_{ijkl}$ are represented in conventional tensor notation, and may have distinct values for each value of m and n and i, j, k, and l respectively.

In the various equations, where a lower case subscript is repeated in a product, such repetition implies in conventional manner a summation over the various values of the subscript. It is noted that stress and strain, and quantities representing stress and strain such as stress components and strain components, may depend on externally applied force or stimulation of the piezoelectric device 100, and moreover, may be time varying, for example, during operation of the piezoelectric device 100.

The region of integration in the integral of Equation 1A can be broken into three regions of integration, each representing a device component of the piezoelectric device 100, with a first region from $-(b'''+2b')$ to $-b'''$ representing electrode 124, a second region from $-b'''$ to $b'''$ representing the layer of piezoelectric material 110, and a third region from $b'''$ to $b'''+2b'$ representing electrode 122. Each of these integrals can be rewritten as an infinite sum of strain components of that device component represented by the corresponding region of integration. That is, Equations 1A and 1B can be rewritten as:

$$T_{ij}^{(n)} = \int_{-b'''}^{b'''} T_{ij}''' x_2^n \, dx_2 + \int_{-(b'''+2b'')}^{-b'''} T_{ij}'' x_2^n \, dx_2 + \int_{b'''}^{b'''+2b'} T_{ij}' x_2^n \, dx_2 \qquad \text{(Eq. 3)}$$

$$= \sum_{m=0}^{\infty} B'''_{mn} c'''_{ijkl} S'''_{kl}^{(m)} + \sum_{m=0}^{\infty} B''_{mn} c''_{ijkl} S''_{kl}^{(m)} + \sum_{m=0}^{\infty} B'_{mn} c'_{ijkl} S'_{kl}^{(m)} \qquad \text{(Eq. 4)}$$

In Equations 3 and 4, a single prime mark (i.e. ') designates properties of electrode 122, a double prime mark (i.e. ") designates properties of electrode 124, and a triple prime mark (i.e. ''') designates properties of the layer of piezoelectric material 110. The term $B'_{mn}$ of the third sum in Equation 4 is a constant of integration of the third integral of Equation 3, the term $c'_{ijkl}$ is an elastic constant tensor of electrode 122, and $S'_{kl}^{(m)}$ are strain components of electrode 122. The term $B''_{mn}$ of the second sum in Equation 4 is a constant of integration of the second integral of Equation 3, the term $c''_{ijkl}$ is an elastic constant tensor of electrode 124, and $S''_{kl}^{(m)}$ are strain components of electrode 124. Finally, the term $B'''_{mn}$ of the first sum in Equation 4 is a constant of integration of the first integral of Equation 3, the term $c'''_{ijkl}$ is an elastic constant tensor of the layer of piezoelectric material 110, and $S'''_{kl}^{(m)}$ are strain components of the layer of piezoelectric material 110. The various strain components $S'_{kl}^{(m)}, S''_{kl}^{(m)}, S'''_{kl}^{(m)}$ may be more particularly identified as strain components at the faces of electrode 122, layer of piezoelectric material 110, and electrode 124 respectively.

In this embodiment of the present invention, the computer-implemented system 200 forms 301 the first model by expressing stress in the piezoelectric device 100 in the form shown in Equation 4. Values for the constants of integration $B'_{mn}$, $B''_{mn}$ and $B'''_{mn}$ are given as:

$$B'_{mn} = \frac{(b'''+2b')^{m+n+1} - (b''')^{m+n+1}}{m+n+1}, \qquad \text{(Eq. 5A)}$$

$$B''_{mn} = \frac{(-b''')^{m+n+1} - [-(b'''+2b'')]^{m+n+1}}{m+n+1}, \text{ and} \qquad \text{(Eq. 5B)}$$

$$B'''_{mn} = \frac{(b''')^{m+n+1} - (-b''')^{m+n+1}}{m+n+1}. \qquad \text{(Eq. 5C)}$$

The computer-implemented system 200 next manipulates 303 the first model formed as described above to form a second model of the piezoelectric device 100. The second model expresses stress in the piezoelectric device 100 as a function of an elastic property of the piezoelectric device 100. In this embodiment of the present invention, the second model expresses stress in the piezoelectric device 100 in terms of strain of a device component of the device 100. More particularly, the stress in the piezoelectric device 100, as represented by stress components $T_{ij}^{(n)}$, is expressed as the sum of a sequence of strain components of the layer of the piezoelectric material 110. The computer-implemented system 200 models displacement of the electrodes 122, 124 in the second model as being substantially equal to displacement of the layer of piezoelectric material 110 during modeled operation of the piezoelectric device 100. More particularly, the computer-implemented system 200 models displacement of electrode 122 as being equal to displacement of that face 112 of the layer of piezoelectric material 110 to which it is affixed, and models displacement of electrode 124 as being equal to displacement of that face 114 of the layer of piezoelectric material 110 to which it is affixed. The strain components $S'_{kl}^{(m)}$ and $S''_{kl}^{(m)}$ of the electrodes 122, 124 are approximated by the strain components $S'''^{(m)}_{kl}$ of the face of the layer of piezoelectric material 110. It is noted that once the piezoelectric device 100 is fabricated, actual displacement of electrodes 122, 124 and the layer of piezoelectric material 110 may differ in magnitude due, for example, to strain induced variations in shape of the electrodes 122, 124 or the layer of piezoelectric material 110.

Ignoring such variation, the computer-implemented system 200 manipulates 303 the first model by replacing dependence therein on the strain components $S'^{(m)}_{kl}$, $S''^{(m)}_{kl}$ of electrodes 122, 124 with a corresponding dependence on the strain components $S'''^{(m)}_{kl}$ of the layer of piezoelectric material 110. More particularly, the computer-implemented system 200 forms the second model by expressing stress in the piezoelectric device 100 as $$T^{(n)}_{ij} \cong \sum_{m=0}^{\infty} (B'''_{mn} c'''_{ijkl} + B''_{mn} c''_{ijkl} + B'_{mn} c'_{ijkl}) S'''^{(m)}_{kl}, \qquad (Eq. 7)$$

with $n = 1, 2, \ldots \infty$.

By eliminating expressed dependence on the strain components $S'^{(m)}_{kl}$, $S''^{(m)}_{kl}$ of the electrodes 122, 124, the computer-implemented system 200 has significantly reduced the computational complexity of the second model of the piezoelectric device 100 relative to the first model. The one infinite summation of Equation 7 is believed to be easier to estimate that the three infinite summations of Equation 4. Further, useful information about the electrodes 122, 124, such as their stiffness quality, has been retained by the second model despite the reduction in computational complexity witnessed therein relative to the first model. The second model is believed to be accurate where the thickness 2b, 2b" of each electrode 122, 124 respectively is about five percent or less of the total thickness 2(b'+b"+b''') of the piezoelectric device 100.

It is noted that in this embodiment of the present invention the second model expresses information about a subsystem of device components (i.e. the electrodes 122, 124) without expressed dependence on the strain components of that subsystem of device components (i.e. the strain components $S'^{(m)}_{kl}$ and $S''^{(m)}_{kl}$ of the electrodes 122, 124). It is further noted that in this embodiment of the present invention the second model expresses information about one or more device components (i.e. the electrodes 122, 124) in terms of elastic properties of another device component (i.e. the strain components $S'''^{(m)}_{kl}$ of the layer of piezoelectric material 110).

Preferably the computer-implemented system 200 further reduces complexity of the second model by estimating only the first three stress components of the piezoelectric device 100 and by ignoring strain components of order four or more. Strain components of order greater than three are believed to yield significantly less useful information than the first four strain components $S'''^{(0)}_{kl}$, $S'''^{(1)}_{kl}$, $S'''^{(2)}_{kl}$, and $S'''^{(3)}_{kl}$. The computer-implemented system 200 can thus alternatively and preferably form the second model by expressing stress in the piezoelectric device 100 as $$T^{(n)}_{ij} \cong \sum_{m=0}^{3} (B'''_{mn} c'''_{ijkl} + B''_{mn} c''_{ijkl} + B'_{mn} c'_{ijkl}) S'''^{(m)}_{kl}, \qquad (Eq. 8)$$

with $n = 1, 2, 3$.

When the electrodes 2b' and 2b" are each thinner than about five percent of total device thickness, the computational complexity of the second model can be further reduced. The computer-implemented system 200 achieves such reduction by estimating $B'_{mn}$ and $B''_{mn}$ as:

$$B'_{mn} \cong \frac{2[b'''^{(m+n+1)}]b'}{b'''}, \text{ and} \qquad (Eq. 9)$$

$$B''_{mn} \cong \frac{-2[(-b''')^{(m+n+1)}]b''}{b'''}. \qquad (Eq. 10)$$

Using these estimates for $B'_{mn}$ and $B'_{mn}$, the computer-implemented system 200 estimates the stress components $T^{(n)}_{ij}$ for the piezoelectric device 100 as $$T^{(n)}_{ij} \cong \sum_{m=0}^{M} c'''_{ijkl} S'''^{(m)}_{kl} \qquad (Eq. 11)$$

$$\left[ B'''_{mn} + (2b''')^{(m+n+1)} * \left( \frac{c'_{ijkl} b' - (-1)^{(m+n+1)} c''_{ijkl} b''}{c'''_{ijkl} b'''} \right) \right],$$

where M preferably is equal to three. For symmetric electrodes 122, 124, the computer-implemented system 200 further reduces complexity of the second model by using the relations b'=b" and $c'_{ijkl}=c_{ijkl}$ yielding $$T^{(n)}_{ij} \cong \sum_{m=0}^{M} B'''_{mn} c'''_{ijkl} S'''^{(m)}_{kl} \left[ 1 + 2(m+n+1) \frac{c'_{ijkl} b'}{c'''_{ijkl} b'''} \right]. \qquad (Eq. 12)$$

Alternatively, the first model may be manipulated 303 to form a second model of the piezoelectric device 100 that expresses stress components $T^{*(n)}_{ij}$ for the subsystem of device components comprising both electrodes 122, 124. In such case, the computer-implemented system 200 forms the second model by eliminating terms therein expressly dependent on $B'''_{mn}$ in Equation 11, yielding $$T^{(n)}_{ij} \cong \qquad (Eq. 13)$$

$$\sum_{m=0}^{M} c'''_{ijkl} S'''^{(m)}_{kl} \left[ 2(b'''^{(m+n+1)}) * \frac{c'_{ijkl} b' - (-1)^{(m+n+1)} c''_{ijkl} b''}{c'''_{ijkl} b'''} \right].$$

Equation 13 has reduced computational complexity relative to Equation 11 due to elimination of the terms expressly dependent on $B'''_{mn}$. The computer-implemented system 200 then performs the summation in Equation 13 to determine the value of the stress components $T^{*(n)}_{ij}$ of the subsystem of electrodes 122, 124. Where the electrodes 122, 124 are symmetric, the computer-implemented system 200 may alternatively use relations b'=b" and $c'_{ijkl}=c''_{ijkl}$ to further reduce the computational complexity of Equation 13, yielding:

$$T^{(n)}_{ij} \cong \sum_{m=0}^{N} B'''_{mn} c'''_{ijkl} S'''^{(m)}_{kl} \left[ 2(m+n+1) c'_{ijkl} \frac{b'}{c'''_{ijkl} b'''} \right], \qquad (Eq. 14)$$

and then perform the summation in Equation 14.

The computer-implemented system 200 applies 305 the second model to generate a modeled property of the piezoelectric device 100. Such modeled property may be the stiffness of the piezoelectric device 100, or the stiffness of its electrodes 122, 124. The modeled property can be used directly as a measure of device quality, or alternatively, can be subjected to further analysis to determine other properties of the piezoelectric device 100. Various mechanical and electrical properties of the piezoelectric device 100 depend either entirely or in part on its stress components $T_{ij}^{(n)}$, and can be accurately verified in accordance with this method.

For example, equations for expressing the stiffness and the stable oscillation frequency of the piezoelectric device 100 as functions of the stress components $T_{ij}^{(n)}$ thereof are given in the inventors' published article "Finite Element Analysis of the Piezoelectric Vibrations of Quartz Plate Resonators with Higher-Order Plate Theory" by Ji Wang, Yook-Kong Yong, Tsutomu Imai, *Proceedings of 1997 IEEE International Frequency Control Symposium*, May 28–30, 1997, Orlando, Fla., pp. 650–658, the entirety of which is incorporated herein by reference. This article did not disclose how to determine or accurately estimate the stress components $T_{ij}^{(n)}$ of the piezoelectric device 100. In accordance with the present invention, values for the stress components $T_{ij}^{(n)}$ of the piezoelectric device 100 estimated by applying Equation 11 or Equation 12 are substituted for the exact values of the stress components $T_{ij}^{(n)}$. This yields estimations for the stiffness and stable oscillation frequency of the piezoelectric device 100 that can be solved by computer. It is noted that additional input values typically are required, such as the size, shape, mass, and piezoelectric constants of the layer of piezoelectric material 110, and the size, shape, mass, and conductivity of the electrodes 122, 124.

In one embodiment of the present invention, the value of the stress components $T_{ij}^{(n)}$ of the piezoelectric device 100 are estimated in accordance with present invention, for example, by using either Equation 11 or Equation 12. These estimated values for the stress components $T_{ij}^{(n)}$ are treated as being equal to the exact values therefor in a pair of two-dimensional piezoelectric constitutive equations for the piezoelectric device 100 given as:

$$T_{ij}^{(n)} = \sum_{m=0}^{N} B_{mn}(c_{ijkl}S_{kl}^{(m)} - e_{kij}E_{k}^{(m)}) \text{ and} \qquad \text{(Eq. 15)}$$

$$D_{i}^{(n)} = \sum_{m=0}^{N} B_{mn}(e_{ijk}S_{kl}^{(m)} - \varepsilon_{ij}E_{j}^{(m)}). \qquad \text{(Eq. 16)}$$

In Equations 15 and 16, $T_{ij}^{(n)}$, $D_{i}^{(n)}$, $S_{kl}^{(m)}$, $E_{k}^{(m)}$, $B_{mn}$, $c_{ijkl}$, $e_{kij}$, and $e_{ij}$ respectively are stress components, electric displacement components, strain components, electric field components, integral constants, elastic constants, piezoelectric constants, and dielectric constants. The integral constants $B_{mn}$ in Equations 15, 16 above and in the applicable Equations below are equal to $B'''_{mn}$ as given above in Equation 5C.

Using the two-dimensional constitutive equations (Eqs. 15, 16) the stiffness of the piezoelectric device 100, as represented by a generalized stiffness matrix K, can be found via finite element analysis. Starting with an $n^{th}$ order generalized displacement field $u^{(n)} = \{u_1^{(n)}, u_2^{(n)}, u_3^{(n)}, \phi^{(n)}\}^T_{4\times 1}$ wherein n=0, 1, 2, 3 and wherein $\phi^{(n)}$ represents electric potential, a generalized displacement vector u for the piezoelectric device 100 is formed using third order plate theory. The superscript T designates a transposition operation in conventional manner. The generalized displacement vector u is given as $$u = \begin{bmatrix} u^{(0)} \\ u^{(1)} \\ u^{(2)} \\ u^{(3)} \end{bmatrix}_{16\times 1}. \qquad \text{(Eq. 17)}$$

With abbreviated notations, a generalized nth order stress vector $T^{(n)}$ and a generalized $n^{th}$ order strain vector $S^{(n)}$ are then defined by:

$$S^{(n)} = \{S_1^{(n)}, S_2^{(n)}, S_3^{(n)}, S_4^{(n)}, S_5^{(n)}, S_6^{(n)}, E_1^{(n)}, E_3^{(n)}, E_3^{(n)}\}^T_{9\times 1} \qquad \text{(Eq. 18)}$$

and $$T^{(n)} = \{T_1^{(n)}, T_2^{(n)}, T_3^{(n)}, T_4^{(n)}, T_5^{(n)}, T_6^{(n)}, D_1^{(n)}, D_2^{(n)}, D_3^{(n)}\}^T_{9\times 1}, \qquad \text{(Eq. 19)}$$

wherein $D_j^{(n)}$ and $E_j^{(n)}$ respectively are electric displacement components and electric field components.

Generalized strain and stress vectors S, T are next defined in terms of the generalized $n^{th}$ order strain and stress vectors $S^{(n)}$, $T^{(n)}$ by:

$$S = \{S^{(0)}, S^{(1)}, S^{(2)}, S^{(3)}\}^T_{36\times 1} \qquad \text{(Eq. 20)}$$

and $$T = \{T^{(0)}, T^{(1)}, T^{(2)}, T^{(3)}\}^T_{36\times 1}. \qquad \text{(Eq. 21)}$$

Constitutive Equations 15, 16 may then be given in matrix form as $$T = CS, \text{ where} \qquad \text{(Eq. 22)}$$

$$C = \begin{bmatrix} B_{00}\overline{C} & 0 & B_{02}\overline{C} & 0 \\ 0 & B_{11}\overline{C} & 0 & B_{13}\overline{C} \\ B_{20}\overline{C} & 0 & B_{22}\overline{C} & 0 \\ 0 & B_{31}\overline{C} & 0 & B_{33}\overline{C} \end{bmatrix}_{36\times 36}, \text{ and} \qquad \text{(Eq. 23)}$$

$$\overline{C} = \begin{bmatrix} c & -e^T \\ e & \varepsilon \end{bmatrix}_{9\times 9}, \text{ and where} \qquad \text{(Eq. 24)}$$

c is a matrix of elastic constants of the piezoelectric material, e is a matrix of piezoelectric constants of the piezoelectric material, and is a matrix of dielectric constants of the piezoelectric material. The generalized strain vector S is thus linearly related to the generalized stress vector T.

Variational equations of motion for the piezoelectric device 100 written in matrix form are given as $$\int_A \delta S^t DS \, dA + \int_A \rho \delta u^t \ddot{u} \, dA = \int_C \delta u^t f \, dS + \int_A \delta u^t F \, dA. \qquad \text{(Eq. 25)}$$

where

A represents the area of the piezoelectric device 100, and C represents the boundary of the area A. The terms f and F are surface and face traction vectors respectively. The matrix D is given as $$D = \begin{bmatrix} B_{00}\overline{D} & 0 & B_{02}\overline{D} & 0 \\ 0 & B_{11}\overline{D} & 0 & B_{13}\overline{D} \\ B_{20}\overline{D} & 0 & B_{22}\overline{D} & 0 \\ 0 & B_{31}\overline{D} & 0 & B_{33}\overline{D} \end{bmatrix}_{36\times 36}, \text{ with} \quad (Eq. 26)$$

$$\overline{D} = \begin{bmatrix} c & -e^T \\ -e & -\varepsilon \end{bmatrix}_{9\times 9}. \quad (Eq. 27)$$

The matrix $m_m^{(n)}$ is given as $$m_m^{(n)} = \rho B_{mn}[1 + (m+n+1)R] \begin{bmatrix} 1 & 0 & 0 & 0 \\ 0 & 1 & 0 & 0 \\ 0 & 0 & 1 & 0 \\ 0 & 0 & 0 & 0 \end{bmatrix}_{4\times 4}, \text{ with} \quad (Eq. 28)$$

$$R = \frac{b'\rho' + b''\rho''}{b'''\rho'''}, \text{ and with} \quad (Eq. 29)$$

$\rho'$ representing the density of the upper electrode 122, $\rho''$ representing the density of the lower electrode 124, $\rho'''$ being equal to $\rho$ and representing the density of the piezoelectric material 110, and R representing the mass ratio of the electrodes 122, 124 relative to the piezoelectric material 110.

Following a conventional discretization procedure, a finite element implementation for the constitutive equations is given as:

$$u = \begin{bmatrix} u^{(0)} \\ u^{(1)} \\ u^{(2)} \\ u^{(3)} \end{bmatrix}_{16\times 1} = NU = [\overline{N_1}, \overline{N_2}, \ldots, \overline{N_l}] \begin{bmatrix} U_1 \\ U_2 \\ \vdots \\ U_l \end{bmatrix}_{16l\times 1}, \quad (Eq. 30)$$

where $\overline{N_i} = N_i I_{16\times 16}$, $S = \partial_s NU = BU$, $B = [B_1, B_2, \ldots, B_l]_{36\times 16l}$, and $i = 1, 2, \ldots l$, and wherein l is the number of nodes of each element, U is the discretized displacement vector, $N_i$ are the shape functions of the piezoelectric device 100 and the $B_i$ matrix is given as $$B_i = \begin{bmatrix} \partial_u N_i & \partial_u^{(1)} N_i & 0 & 0 \\ 0 & \partial_u N_i & \partial_u^{(2)} N_i & 0 \\ 0 & 0 & \partial_u N_i & \partial_u^{(3)} N_i \\ 0 & 0 & 0 & \partial_u N_i \end{bmatrix}_{36\times 16}. \quad (Eq. 31)$$

The matrix B represents the effect of the shape of the piezoelectric device 100.

The generalized stiffness matrix K is then given as $$K = \int_A B^T D B \, dA, \quad (Eq. 32)$$

where the integration is over the area A of the piezoelectric device 100. The integral of Equation 32 may be solved by a conventional estimation technique.

The matrix K may also be used to obtain the stable oscillation frequency $\omega$ of the piezoelectric device 100 by solving the matrix equation $$KU - \omega^2 MU = 0 \quad (Eq. 33)$$

for $\omega^2$, and then by taking the square root of the value or values of $\omega^2$ so obtained. The matrix M here is a conventional mass matrix of the piezoelectric device 100, and is given as $$M = \begin{bmatrix} m_0^{(0)} & 0 & m_0^{(2)} & 0 \\ 0 & m_1^{(1)} & 0 & m_1^{(3)} \\ m_2^{(0)} & 0 & m_2^{(2)} & 0 \\ 0 & m_3^{(1)} & 0 & m_3^{(3)} \end{bmatrix}_{16\times 16}, \text{ where} \quad (Eq. 34)$$

$m_m^{(n)}$ (m, n=0, 1, 2, 3) is given in Equation 28. Equation 33 is similar to an eigenvalue problem except for the appearance of the matrix MU instead of the identity matrix I, and may be solved using a variety of well known techniques. It is noted that the stable oscillation frequency $\omega$ is given in radians/second, and may further have a complex value. Derivation of the various formulas of the finite element analysis may be accomplished in conventional manner, such as in the manner shown in the inventors' above cited article.

In accordance with the present invention, once a modeled property for the piezoelectric device 100 is generated 305, such as the stiffness matrix K or the oscillation frequency $\omega$, it is analyzed 307 by the computer-implemented system 200 to verify whether the design for the piezoelectric device 100 meets a design specification. Such design specification can be, for example, the stiffness specification or the stiffness quality of the electrodes 122, 124 on an absolute scale or other scale. The results of the analysis are output on the output device 230 by the computer-implemented system 200. Such results may suggest possible modifications to the design of the piezoelectric device 100 prior to manufacturing. Such modified designs can then be verified by the computer-implemented system 200. Such iterative processing allows various possible designs to be verified and improved at design. According to the present invention, design verification does not require physical prototyping of piezoelectric devices.

In accordance with the present invention, stiffness qualities of an electrode or electrodes 122, 124, the layer of piezoelectric material 110, and the piezoelectric device 100 as a whole can be determined during design of the piezoelectric device 100 by modeling displacement of one or more electrodes 122, 124 as being substantially equal in distance to displacement of the layer of piezoelectric material 110. This allows stress in the piezoelectric device 100 to be expressed as a function of an elastic property of a device component, such as an electrode 122, 124 or the layer of piezoelectric material 110. Electrode stiffness and device quality can be determined beneficially without the conventional requirements of post production addition or removal of electrode material or other bracing. Instances of improved piezoelectric devices of the same design may thus be highly similar in size, shape, and appearance relative to conventional piezoelectric devices in finished state.

Various modifications of the above described method are possible as will be apparent to those skilled in the art upon reading the above disclosure and viewing the corresponding figures. For example, in an alternative embodiment of the present invention, the stiffness of the electrodes 122, 124 or the layer of piezoelectric material 110 are the elastic properties referenced in acts 301 and 303. Similarly, the elastic property of act 301 may differ from the elastic property of act 303. For example, the elastic property of act 301 may be the stiffness of the piezoelectric device 100 as a whole represented as a function of position therein, whereas the elastic property of act 303 may be the stiffness of or strain of the layer of piezoelectric material 110.

Referring now to FIG. 4, there is shown a flowchart illustrating an alternative and preferred embodiment of the method for verifying the design of the piezoelectric device 100 in accordance with the present invention. This embodiment of the method can be performed by the computer-implemented system 200 described above. In step 401, the computer-implemented system 200 forms a first model of the piezoelectric device 100 which expresses stress of a first device component or subsystem as a function of the strain of the same device component or subsystem. For example, computer-implemented system may form 401 a first model that expresses the stress components $T'''^{(n)}_{ij}$ the layer of piezoelectric material 110 as a function of strain components $S'''^{(m)}_{kl}$ of the layer of piezoelectric material 110. In step 403, the computer-implemented system 200 forms a second model of the piezoelectric device 100 that expresses stress of a different device component or a different device subsystem as a function of strain of the first device component or subsystem. This is achieved by modeling displacement of each electrode 122, 124 as being substantially equal in distance to displacement of the corresponding face 112, 114 of the layer of piezoelectric material 110. Consequently, the strain of the electrodes 122, 124 can be approximated by the strain of the layer of piezoelectric material 110. Continuing the above example, the computer-implemented system may form 403 a second model that expresses the stress components $T'^{(n)}_{ij}$ and $T''^{(n)}_{ij}$ of electrodes 122, 124 as a function of strain components $S'''^{(m)}_{kl}$ of the layer of piezoelectric material 110.

In step 405, the computer-implemented system 200 combines the stress terms of the first and second models to model stress in the piezoelectric device 100 as a function of strain of the first device component. Finally, the combined stress terms are analyzed 407 to verify that the design meets a design specification for a modeled elastic property. Such modeled property may be, for example, the stiffness quality of the electrodes 122, 124 or other device component. Preferably, the computer-implemented system 200 combines 405 the stress components $T'^{(n)}_{ij}$, $T''^{(n)}_{ij}$, $T'''^{(n)}_{ij}$ of the various device components as a weighting of strain components $S'''^{(m)}_{kl}$ of the layer of piezoelectric material 110, such as in Equations 7, 8, 11, 12, 13, or 14, and then analyzes 407 such weighting to verify that the design of the piezoelectric device 100 meets a desired design specification for a modeled property, such as a design specification for electrode stiffness.

Referring now to FIG. 5 there is shown a flowchart of an another alternative embodiment of the method for verifying the design of the piezoelectric device 100 in accordance with the present invention. This embodiment of the method can be performed by the computer-implemented system 200 described above. In step 501, the computer-implemented system 200 forms 501 a model of the piezoelectric device 100 that expresses stress in the piezoelectric device 100 as a weighting of strain components of a device component, such as a weighting of strain components of an electrode 122, 124. For example, the computer-implemented system 200 can apply Equation 11 or 12 to express stress in the piezoelectric device 100 as a weighting of strain components $S'''^{(m)}_{kl}$ of the layer of piezoelectric material 110. Next, the computer-implemented system 200 analyzes the weighting to verify whether the piezoelectric device 100 meets design specifications. For example, the computer-implemented system 200 may analyze the weighting of strain components $S'''^{(m)}_{kl}$ of the layer of piezoelectric material 110 to determine whether the piezoelectric device 100 meets a design specification for electrode or total stiffness. This embodiment of the present invention beneficially requires formation of only one model of the piezoelectric device 100.

Referring now to FIG. 6, there is shown a flowchart of another alternative embodiment of the method for verifying the design of the piezoelectric device 100 in accordance with the present invention. This embodiment of the method can also be performed by the computer-implemented system 200 described above. In step 601, the stress components for a first portion of the piezoelectric device 100 are expressed in terms of strain components of a second portion of the piezoelectric device 100. For example, the the first portion preferably may comprise both of the electrodes 122, 124 modeled together, and the second portion may comprise the layer of piezoelectric material 110. The expression of step 601 is then analyzed to verify whether the design of the piezoelectric device 100 or portion thereof meets design specifications.

By applying the method of the present invention for verifying design of a piezoelectric device, an improved piezoelectric device beneficially can be produced. The improved piezoelectric device is verified during its design, and consequently has reduced requirements for post production processing relative to conventional piezoelectric devices. Electrode stiffness and device quality can be determined without the conventional requirements of post production addition or removal of electrode material or other bracing. Instances of improved piezoelectric devices may thus be more uniform in size, shape, and appearance than conventional piezoelectric devices in finished state. However, the improved piezoelectric devices can be further modified after fabrication in conventional manner if desired.

In the above description and accompanying figures, references to the computer-implemented system 200 of FIG. 2 and the piezoelectric device 100 of FIG. 1 are made to particularly describe various embodiments of the present invention with respect to particular component elements 110, 122, 124 of a particular piezoelectric device 100 as performed by a preferred system 200 for performing the method of the present invention. The above description and accompanying figures are included to disclose the structure and operation of various preferred embodiments of the present invention and are not intended to limit the scope of the present invention. Various modifications to and variations of the present invention will be apparent to those skilled in the art after reading the above description and viewing the accompanying figures. For example, the system and the method of the present invention can generally be used to verify design characteristics of piezoelectric devices having a layer of piezoelectric material and at least one electrode affixed to the face of such piezoelectric material, and is not limited to designs having exactly two electrodes. These and other modifications to and variations are provided for by the present invention, which is limited only by the following claims.

What is claimed is:

1. A method for verifying a design for a device, the device including a piezoelectric material having a face, the device further including an electrode affixed to the face of the piezoelectric material, said method comprising:

forming a low computationally complex model expressing stress in the electrode as a function of strain components of the piezoelectric material without expressed dependence on strain components of the electrode; and analyzing said model to verify whether the device meets a design specification.

2. The method of claim 1, wherein said function comprises a weighting of strain components of the piezoelectric material.

3. A method for verifying a design for a device, the device including a piezoelectric material having a face, the device further including an electrode affixed to the face of the piezoelectric material, said method comprising:

forming a first model of the device, said first model expressing stress of the device as a function of stress components of the piezoelectric material and stress components of the electrode, said first model having a first computational complexity;

manipulating said first model to form a second model of the device having a second computational complexity less than said first computational complexity, said second model expressing stress of the device as a function of strain components of the piezoelectric material, said second model expressing information about the stress of the electrode without expressed dependence on strain components of the electrode;

applying said second model to generate a modeled property of the device; and analyzing said modeled property to verify whether the design for the device meets a design specification.

4. The method of claim 3, wherein said modeled property is a stiffness of the device.

5. The method of claim 3, wherein said modeled property is a stiffness of the device as a function of position in the device.

6. The method of claim 3, wherein said modeled property is a stiffness of the electrode.

7. The method of claim 6, wherein said second model treats displacement of the electrode as being substantially equal in distance to displacement of the face of the piezoelectric material.

8. The method of claim 3 wherein said second model treats displacement of the electrode as being substantially equal in distance to displacement of the face of the piezoelectric material.

9. The method of claim 3, wherein said second model treats displacement of the electrode as being uniform within the electrode along a normal to the face of the piezoelectric material.

10. The method of claim 3, wherein said second model treats displacement of the device as being substantially continuous across a bonding of the electrode with the face of the piezoelectric material.

11. The method of claim 3 wherein:

forming said first model of the device comprises expressing stress components of the piezoelectric material as a first function of strain components of the piezoelectric material; and manipulating said first model to form said second model comprises:

expressing stress components of the electrode as a second function of strain components of the piezoelectric material, and expressing strain components of the electrode as a third function of strain components of the piezoelectric material by modeling displacement of the electrode as being substantially equal to displacement of the face of the piezoelectric material; and combining said first, second and third functions to form said second model, thereby eliminating in said second model of the device any expressed dependence on strain components of the electrode.

12. The method of claim 11 wherein said displacement of the electrode is further modeled as being substantially equal to displacement of the face of the piezoelectric material.

13. The method of claim 11 wherein said displacement of the electrode is further modeled as being substantially uniform within the electrode.

14. The method of claim 3, wherein forming said first model of the device comprises:

expressing stress components of the piezoelectric material as a first function of strain components of the piezoelectric material;

expressing stress components of the electrode as a second function of strain components of the electrode; and combining said first and second functions to express stress of the device as a function of both strain components of the piezoelectric material and strain components of the electrode.

15. The method of claim 3, wherein forming said first model comprises expressing stress components of the piezoelectric material as a first weighting of strain components of the piezoelectric material;

and wherein manipulating said first model to form said second model comprises:

expressing stress components of the electrode as second weighting of strain components of the piezoelectric material by modeling displacement of the electrode as being both substantially equal to displacement of the face of the piezoelectric material and uniform within the electrode; and combining said first and second weightings of strain components to form said second model of the device, said second model expressing stress components of the device as a third weighting of strain components of the piezoelectric material.

16. The method of claim 15 wherein analyzing said modeled property of the device comprises analyzing said third weighting to verify whether the device meets a design specification for said modeled property.

17. The method of claim 15 wherein analyzing said modeled property of the device comprises analyzing said third weighting to verify whether the electrode meets a design specification for said modeled property of the device.

18. An apparatus for verifying a design of a device, the device including a piezoelectric material having a face, the device further including an electrode affixed to the face of the piezoelectric material, said apparatus comprising:

means for forming a first model of the device, said first model expressing stress of the device as a function of stress components of the piezoelectric material and stress components of the electrode, said first model having a first computational complexity;

means for manipulating said first model to form a second model of the device having a second computational complexity less than said first computational complexity, said second model expressing stress of the device as a function of strain components of the piezoelectric material, said second model expressing information about the stress of the electrode without expressed dependence on strain components of the electrode;

means for applying said second model to generate a modeled property of the device; and means for analyzing said modeled property to verify whether the design for the device meets a design specification for the device.

19. A medium readable by a machine, said medium storing a program of instructions capable of directing said machine to perform a method for verify a design of a device, the device including a piezoelectric material having a face, the device further including an electrode affixed to the face of the piezoelectric material, said method comprising:

forming a first model of the device, said first model expressing stress of the device as a function of stress components of the piezoelectric and stress components of the electrode, said first model having a first computational complexity;

manipulating said first model to form a second model of the device having a second computational complexity less than said first computational complexity, said second model expressing stress of the device as a function of strain components of the piezoelectric material, said second model expressing information about the stress of the electrode without expressed dependence on strain components of the electrode;

applying said second model to generate a modeled property of the device; and analyzing said modeled property to verify whether the design for the device meets a design specification for the device.

\* \* \* \* \*

UNITED STATES PATENT AND TRADEMARK OFFICE
CERTIFICATE OF CORRECTION

PATENT NO. : 6,230,113 B1
DATED : May 8, 2001
INVENTOR(S) : Ji Wang et al.

It is certified that error appears in the above-identified patent and that said Letters Patent is hereby corrected as shown below:

<u>Column 17,</u>
Line 30, change "The method of claim 6" to -- The method of claim 3 --.
Line 34, change "The method of claim 3" to -- The method of claim 6 --.

Signed and Sealed this

Twenty-ninth Day of October, 2002

Attest:

Attesting Officer

JAMES E. ROGAN
*Director of the United States Patent and Trademark Office*